United States Patent [19]

Baliga et al.

[11] Patent Number: 4,571,815
[45] Date of Patent: Feb. 25, 1986

[54] METHOD OF MAKING VERTICAL CHANNEL FIELD CONTROLLED DEVICE EMPLOYING A RECESSED GATE STRUCTURE

[75] Inventors: Bantval J. Baliga, Clifton Park; Robert P. Love, Schenectady, both of N.Y.

[73] Assignee: General Electric Company, Schenectady, N.Y.

[21] Appl. No.: 650,315

[22] Filed: Sep. 12, 1984

Related U.S. Application Data

[62] Division of Ser. No. 324,163, Nov. 23, 1981, abandoned.

[51] Int. Cl.[4] ............................................. H01L 21/38
[52] U.S. Cl. ........................................ 29/571; 27/578; 27/580; 27/591; 148/187
[58] Field of Search ................... 148/187; 29/571, 578, 29/580, 591

[56] References Cited

U.S. PATENT DOCUMENTS

| | | | |
|---|---|---|---|
| 3,855,608 | 12/1974 | George et al. | 148/175 X |
| 3,953,879 | 4/1976 | O'Connor-d'Arlach et al. | 357/22 |
| 4,037,245 | 7/1977 | Ferro | 357/38 |
| 4,070,690 | 1/1978 | Wickstrom | 357/68 |
| 4,199,771 | 4/1980 | Nishizaura et al. | 357/22 |
| 4,343,015 | 8/1982 | Baliga et al. | 357/55 |
| 4,364,073 | 12/1982 | Becke et al. | 357/23 |
| 4,437,925 | 3/1984 | Cogan | 29/580 |
| 4,477,963 | 10/1984 | Cogan | 148/174 |

OTHER PUBLICATIONS

Baliga, International Electron Devices Meeting, "Recessed Gate Junction Field Effect Transistors", Dec. 5-7, 1980, pp. 784-786.

Primary Examiner—George T. Ozaki
Attorney, Agent, or Firm—John R. Rafter; James C. Davis, Jr.; Marvin Snyder

[57] ABSTRACT

A vertical channel junction gate electric field controlled device (e.g., a field effect transistor or a field controlled thyristor) includes a semiconductor base region layer, and a plurality of grooves having vertical walls formed in the upper surface of the base region layer. Between the grooves on the upper surface of the base region layer but not extending to the grooves are upper electrode regions, for example, source electrode regions or cathode electrode regions. Formed in the groove bottoms and sidewalls are junction gate regions. Upper electrode terminal metallization is evaporated generally on the upper device layer, and gate terminal metallization is over the junction gate regions at the bottoms of the grooves. The disclosed structure thus has continuous metallization along the recessed gate regions for a low-resistance gate connection. The structure facilitates fabrication by methods, also disclosed, which avoid any critical photolithographic alignment steps in masking to define the locations of the source (or cathode) and gate regions, and avoid the need for any mask or mask alignment for metal definition when forming electrode metallization. As a result of the structure of the upper electrode and gate regions, it is not critical to avoid any metal deposition on the groove sidewalls.

7 Claims, 9 Drawing Figures

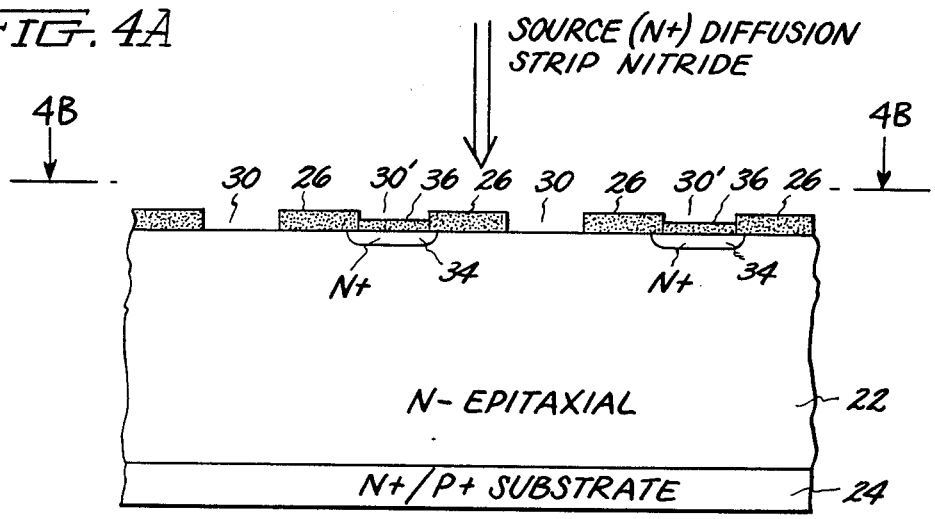
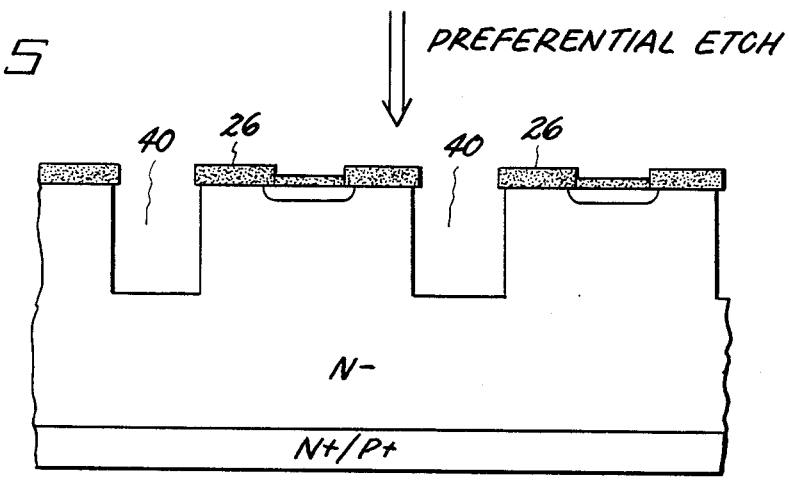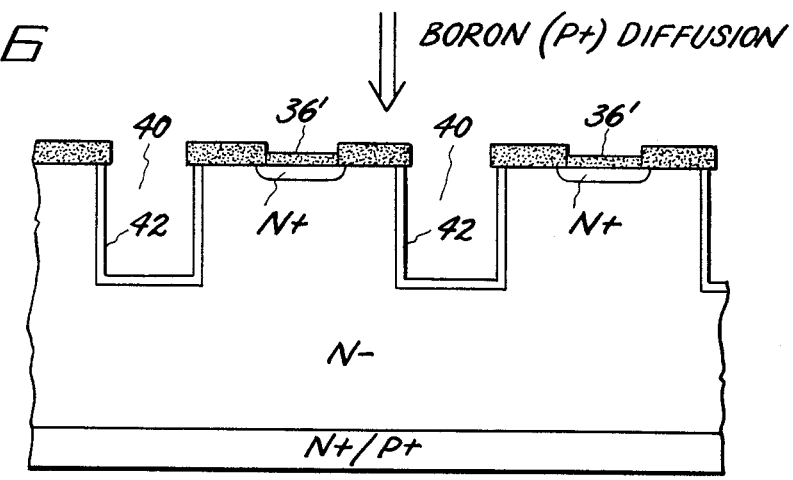

METHOD OF MAKING VERTICAL CHANNEL FIELD CONTROLLED DEVICE EMPLOYING A RECESSED GATE STRUCTURE

This application is a division of application Ser. No. 324,163, filed on Nov. 23, 1981, now abandoned.

BACKGROUND OF THE INVENTION

The present invention relates generally to vertical channel electric field controlled semiconductor devices such as field effect transistors and, more particularly, to such devices employing recessed gate structures, and methods for fabricating such devices.

The present invention is an improvement to the structures and methods disclosed and claimed in commonly-assigned application Ser. No. 324,299, filed concurrently herewith, by Baliga, entitled "VERTICAL CHANNEL FIELD CONTROLLED DEVICE EMPLOYING A RECESSED GATE STRUCTURE AND METHODS FOR MAKING", now abandoned in favor of divisional application Ser. No. 692,073, filed Jan. 17, 1985.

Vertical-channel electric field controlled devices have recently been developed, and are suitable for power switching applications at relatively high voltages, in excess of 500 volts. These devices are of several types, including field effect transistors (FETs) and field controlled thyristors (FCTs), all having similar gate structures. For convenience, the recessed gate structure and fabrication methods of the present invention are described herein primarily with reference to vertical channel FETs. It will be appreciated, however, that the gate structures and fabrication methods are equally applicable to other forms of vertical-channel field controlled semiconductor devices, such as FCTs.

Briefly, in a vertical-channel FET structure, source and drain regions are formed on opposite surfaces of a semiconductor wafer, the source and drain regions both, for example, being of N+ conductivity type. Intermediate the source and drain regions is an N− conductivity type base region, in turn containing a low resistivity P+ grid or gate defining a number of vertical channels. In one particular form of device, the source (or cathode) and gate regions are elongated finger-like structures, with the source (or cathode) and gate regions interdigitated. The devices are normally on, and therefore conduct with zero gate bias. As reverse gate bias is applied, a depletion region is formed which inhibits or blocks conduction vertically through the device.

Such devices are described in the literature, for example, D. E. Houston, S. Krishna, D. E. Piccone, R. J. Finke and Y. S. Sun, "A Field Terminated Diode", *IEEE Trans. Electron Devices*, Vol. ED-23, No. 8, pp. 905–511 (August 1976). In addition to this Houston et al. literature reference, various forms of such devices are disclosed in the commonly-assigned patents to Ferro U.S. Pat. Nos. 4,037,245, Houston et al. 4,060,821, Baliga 4,132,996, and Hysell et al. 4,170,019. Additional disclosures are found in commonly-assigned Baliga and Wessels application Ser. No. 169,853, filed July 17, 1980, entitled "Planar Gate Turn Off Field Controlled Thyristors And Planar Junction Gate Field Effect Transistors, And Method Of Making Same", which is a continuation of now-abandoned application Ser. No. 938,020, filed Aug. 30, 1978, in turn a continuation-in-part of now-abandoned application Ser. No. 863,877 filed Dec. 23, 1977. Application Ser. No. 169,853 was continued as application Ser. No. 355,005 on Mar. 5, 1982, now abandoned in favor of divisional application Ser. No. 630,473, filed July 11, 1984.

Heretofore there have been two general structures for these devices: planar or surface gate structures wherein the gate is on the surface of the device; and buried gate structures wherein the gate is buried within the base region. Buried gate devices have the advantage of increased source (or cathode) area compared to surface gate devices because, in surface gate devices, the source (or cathode) region must be located between the gate grids and sufficiently separated therefrom to obtain an acceptably high grid-source (or grid-cathode) breakdown voltage. Buried gate structures overcome this particular problem and enable a higher blocking gain to be achieved. Another advantage of buried grid devices has been the need for less critical photolithographic alignment in fabrication compared to those required for surface gate devices wherein interdigitated gate and source (or cathode) regions are fabricated to close tolerances.

One significant disadvantage to buried gate devices, however, has been that the inability to metallize a buried gate along its entire length results in higher gate resistance, which limits the frequency response of buried grid FETs and FCTs. In typical buried gate devices, remote gate contacts are required, for example, at the periphery of the wafer or device.

A hybrid approach is disclosed in the above-identified commonly-assigned Houston et al U.S. Pat. No. 4,060,821, wherein the gate is divided into surface gate portions and buried gate portions, with the buried gate portions having a greater lateral extent; at the device surface, the surface area of the cathode structure is substantially greater than that of the grid structure. This device, however, is fabricated using diffusion techniques to from the buried gate portion, with the result that the shape of the buried gate is somewhat semi-cylindrical, resulting in an undesirably small channel length-to-width ratio.

In particular, it has recently been appreciated that vertically-walled gate structures wherein the gates or grids are rectangular in cross-section provide significantly higher blocking gain. For example, the above-identified Baliga et al. application Ser. No. 169,853 describes planar, junction gate FETs and FCTs having higher forward blocking capabilities and higher blocking gains than diffused-gate devices. As there described, preferential etch and refill techniques may be employed to achieve the substantially vertical walls and rectangular cross-sections. However, the epitaxial refill process is complex, and results in poor yield unless extreme care is taken during the refill to obtain a planar surface with no voids in the grooves.

In the above-identified commonly-assigned application Ser. No. 692,073, filed concurrently herewith, by Baliga, there are described and claimed vertical channel field controlled devices employing recessed gate structures and methods of making such devices, which overcome or avoid many of these problems. In particular, the described recessed gate structures achieve good metal contact to source and gate regions, provide self-alignment of source and gate regions during a single masking step, and avoid the need for photolithographic metal definition steps.

Briefly, in an FET having a gate structure as described in the above-identified application Ser. No. 324,299, deep grooves are provided in a semiconductor substrate comprising a source layer on the surface of a base layer. In the bottoms of the grooves are recessed gate fingers of appropriate semiconductor type. This structure can be fabricated using a single mask to define the locations of the elongated source regions and the elongated gate grooves, and two such fabrication methods are specifically described in the above-identified application Ser. No 692,073. Significantly, this structure enables metallization for the source and gate electrode to be simply evaporated generally onto the surface of the wafer. The metal which strikes the surface becomes source metallization, and the metal which enters the grooves metallizes the groove bottom to become gate metallization. The need for a critical metal definition step is therefore avoided.

However, there is a disadvantage in the specific structures disclosed in Baliga application Ser. No. 692,073 in that metallization on the groove sidewalls may cause a short between the source (or cathode) and the gate, requiring careful etching of the groove sidewalls to keep them free of metal. Similarly, at the bottoms of the grooves, the PN junction between the gate structure and base region may be partially exposed, in which case it is desirable to keep the groove sidewalls clear of metallization to avoid partially or completely shorting the gate.

The present invention improves the structures of application Ser. No. 692,073 through the provision of a structure which retains the various advantages of the basic recessed gate structure, but which tolerates a degree of metal deposited on the groove sidewalls.

Further, in accordance with the invention, improved fabrication methods are provided to form the structure. As a result of less critical requirements, significantly better device yields are achieved, as well as higher device breakdown voltages.

SUMMARY OF THE INVENTION

Accordingly, it is an object of the invention to provide a method for fabricating vertical channel field controlled semiconductor devices, such as FETs and FCTs, which methed facilitates high yield fabrication with improved device performance characteristics, and devices made thereby.

Briefly, in accordance with an overall concept of the invention a vertical channel field controlled semiconductor device having a recessed gate structure is provided in which each of a plurality of gate regions comprises a continuous diffused layer in the sidewalls of a groove, respectively, as well as the groove bottom, with an insulating oxide layer at the top of the grooves providing positive separation between the groove sidewalls and the upper surface of the device. Further, the source (or cathode) regions are formed by diffusion through a mask such that the source (or cathode) regions do not extend all the way to the grooves. Therefore, there are no exposed PN junctions terminating at any part of the groove sidewall or bottom surfaces. For purposes of providing a low-resistance gate contact, gate metallization fingers are deposited primarily on the groove bottoms. However, a degree of metallization on the groove sidewalls (which also comprise gate regions) causes no particular harm, so long as the insulating oxide layer between the source and gate metallization is not bridged.

In accordance with a more particular aspect of the invention, a vertical channel field controlled semiconductor device having a recessed gate structure is provided wherein both the sidewalls and bottom of a vertically-walled rectangular cross-section groove are appropriately doped to form the gate region, and the gate metallization comprises fingers extending along the bottoms of the channels in ohmic contact with the gate regions essentially through the entire device for low gate resistance. The gate metallization fingers are recessed below the surface of the device, and are connected to a similarly recessed gate bonding pad, forming an extension of the same metallization.

The source (or cathode) electrode regions are diffused regions formed in the upper surface of the device between and spaced from the grooves. The surface of the source electrode region is protected by an oxide layer having windows for metallization to the source (or cathode) regions.

In the fabrication process, a single mask locates the openings defining the ultimate locations of both the source regions and the gate regions, thereby providing self-alignment between the source fingers. This eliminates any critical photoalignment step for this purpose, and permits relatively uniform spacing throughout the device between adjacent source (or cathode) and gate regions.

Further, a single metallization step provides both the source (or cathode) metallization on the surface of the device and the recessed gate metallization without need for any critically-aligned photolithographic metal definition step normally required in such devices. The aluminum in the recessed gate area is inherently separated from the aluminum connecting the source fingers together at the top surface of the device. A shadowing created by the overhang in the oxide at the top of the grooves aids this aspect.

In accordance with another more particular aspect of the invention, a vertical channel field controlled device such as a junction field effect transistor, having a recessed gate structure, includes a semiconductor base region layer of one conductivity type appropriate for the base region, for example N— type conductivity. There are a plurality of generally parallel vertically-walled grooves formed in the upper surface of the base region layer, and a plurality of elongated diffused source regions formed in the upper surface layer between and spaced from the grooves. The diffused source regions are of the same conductivity type but of higher conductivity than the base region, for example, N+ conductivity type. There is an insulating layer, for example, silicon dioxide, on the upper surface layer between each of the diffused source regions and the adjacent groove, leaving windows for source metallization. Diffused junction gate regions of opposite conductivity type (for example, P+ conductivity) are formed in the sidewalls and bottoms of the grooves. Source terminal metallization is provided generally on the upper surface layer of the device in ohmic contact with the diffused source regions, and over the insulating layer. Recessed gate terminal metallization fingers are provided on the bottoms of the grooves in ohmic contact with the gate regions.

In accordance with another more particular aspect of the invention, a method of fabricating a vertical channel junction gate electric field controlled device, such as a field effect transistor, of the type including a semiconductor base region of one conductivity type, for example, N— type, and a gate region of opposite conductivity type, for example, P+ type, begins with the step of providing a semiconductor wafer having a base layer of the one conductivity type (N— type), and of crystallographic orientation selected to facilitate preferential etching.

Next, a layer of silicon dioxide is formed on one surface of the base layer, with a plurality of parallel elongated windows on one surface of the base layer. It is significant that alternate elongated windows define the ultimate locations of upper electrode regions (e.g., source electrode regions) and gate regions. Thus, the source and gate regions are self-aligned with respect to each other, permitting close and highly accurate interdigitation.

Further, only two masking steps are required for the fabrication of the active region of the device, one of these masking steps being that which provides the elongated windows defining the ultimate locations of the source regions and gate regions. The other masking step is employed to form an etchant barrier of silicon nitride patterned so as to cover the windows in the silicon dioxide layer defining the ultimate locations of the gate regions, but to leave open the windows in the silicon dioxide layer defining the ultimate locations of the upper electrode (e.g. source) regions. Significantly, as will be apparent from the detailed description hereinafter, this second masking step does not require critical photoalignment.

Next, a diffusion is performed. Specifically, impurities appropriate to form diffused upper electrode regions (e.g., source regions) of the one conductivity type and of higher conductivity than the base region (e.g., N+ type) are diffused into the base layer through the windows in the silicon dioxide layer which are not covered by the silicon nitride. At the same time, an oxide layer is grown over the diffused upper electrode regions, but this grown oxide layer is thinner than the oxide layer over the base layer to permit its subsequent removal by selective etching without completely removing the oxide layer over the base layer.

At this point, the silicon nitride barrier is removed, to expose the windows defining the ultimate locations of the gate regions. Using these now-exposed windows, the base layer is preferentially etched to form substantially vertically-walled grooves beneath the gate region windows, with deliberate undercutting of the oxide layer surrounding the gate region windows.

Another diffusion is performed to form the gate regions. Specifically, impurities appropriate to form diffused junction gate regions of the opposite conductivity type (P+ type) are diffused into the sidewalls and bottoms of the grooves. Thus, the outer oundaries of the gate regions are rectangular in cross-section.

At this point, the relatively thinner oxide layer over the diffused upper electrode regions is removed, and metal, preferably aluminum, is evaporated onto the wafer surface to form, simultaneously, metallized source terminals in ohmic contact with the source regions, and elongated metallized gate terminal fingers in ohmic contact with the gate regions at the bottoms of the grooves. It is significant during this step that the presence of the oxide overhang created during the preferential etching to form the grooves results in automatic separation of the gate and source metallization. To complete the device, the source metal fingers are connected to each other on the top surface of the device, while the recessed gate fingers are connected to each other at a recessed gate pad metallized at the same time to a recessed gate pad area formed at the same time as a preferential etching which forms the grooves.

It should be noted that aspects of the present invention have been disclosed in literature published less than one year prior to the filing date hereof. Specifically: B. J. Baliga, "Recessed Gate Junction Field Effect Transistors", International Electron Devices Meeting, Abstract 30.2, pp. 784–786 (December 1980).

BRIEF DESCRIPTION OF THE DRAWINGS

While the novel features of the invention are set forth with particularity in the appended claims, the invention, both as to organization and content, will be better understood and appreciated, along with other aspects and features thereof, from the following detailed description, taken in conjunction with the drawings, in which:

FIG. 4A is a sectional side view depicting diffused upper electrode (or source) regions, with a patterned oxide layer in place prior to preferential etching to form grooves for the base regions and a recessed gate contact pad area;

FIG. 5 is a sectional side view depicting the vertically-walled grooves formed by preferential etching;

FIG. 6 is a sectional side view depicting a diffused P+ gate region in the sidewalls and bottoms of the FIG. 5 grooves;

DESCRIPTION OF THE PREFERRED EMBODIMENT

Preliminarily, as noted above, for convenience the field controlled device and fabrication methods of the invention are described herein primarily in the context of a vertical channel FET having N+ source, P+ gate and N+ drain electrodes. However, the invention is equally applicable to other vertical channel electric field controlled devices, such as an FCT having N+ cathode, P+ gate and P+ anode electrodes. Further, all of the active regions may be of conductivity type opposite to that which is specifically disclosed.

Figure 1:
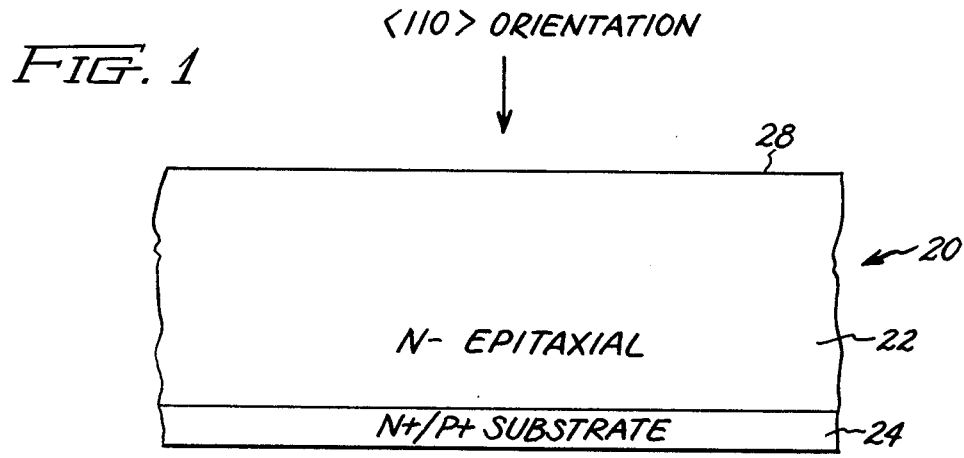
FIG. 1 is a sectional side view depicting a semiconductor wafer provided as an initial step of the process described herein.

With reference first to FIG. 1, as a general initial step a semiconductor wafer 20 is provided, having a base layer 22 of one conductivity type and of appropriate conductivity for the base region of the ultimate device, for example, of N— conductivity type. In the preferred embodiment, to facilitate subsequent preferential etching, the base layer 22 is of particular crystallographic orientation selected to facilitate such preferential etching. As one example, the base layer 22 has a <110> surface crystallographic orientation, which provides a set of <111> crystallographic planes lying perpendicular to the <110> surface.

On the lower surface of the wafer 20 is a lower electrode layer 24 which is either of N+ conductivity type in the case of a drain electrode for a field effect transistor (FET), or of P+ conductivity type in the case of an anode electrode for a field controlled thyristor (FCT). The lower electrode layer 24 may be formed either before, after, or during the steps in accordance with the present invention herein described in detail.

More particularly, a preferred fabrication process in the practice of the present invention begins with the lower layer 24 which accordingly comprises a substrate. A typical example is a 0.01 ohm-cm, antimony-doped silicon substrate of N+ conductivity type having a <110> surface orientation. The base layer 22 is subsequently formed, and comprises a high resistivity, N− type layer epitaxially grown on the substrate 24, the epitaxial growth maintaining the crystallographic orientation of the substrate. As one example, the base layer 22 may be epitaxially grown using dichlorosilane under conditions which provide epitaxial layers with a very low hillock and stacking fault density, as is described in B. J. Baliga, "Control of Hillocks and Stacking Faults during Silicon Vapor Phase Epitaxy", Abs. No. 222, *Electrochem. Soc. Mtg.*, (October 1978). Preferably, the doping profiles of the epitaxial layers are controlled by adjusting the flow of phosphine dopant gas during the growth. A suitable doping level is $2 \times 10^{14}$ per cc with a thickness of fifty microns.

Next, a layer 26 of silicon dioxide (FIG. 2) is formed on the upper surface 28 of the base layer 22, with a plurality of parallel elongated windows 30 and 30'. Alternate windows 30 and 30' define the ultimate locations of the source (or cathode, in the case of an FCT) and gate regions. In the illustrated embodiment, the windows 30 define the ultimate locations of gate regions, and the windows 30' define the ultimate locations of source regions. Significantly, these alternate windows 30 and 30' are defined by same mask (not shown), permitting self-alignment between the source and gate regions of the ultimate device for precisely-spaced interdigitation.

For proper preferential etching as described hereinbelow, the parallel elongated windows 30 and 30' are defined along the <211> crystallographic direction on the <110> surface of the base layer 22.

Figure 2:
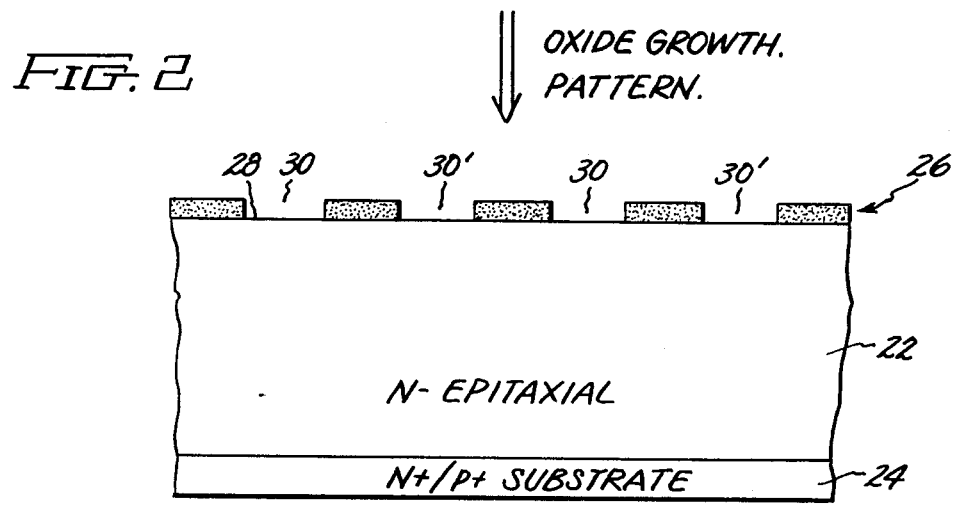
FIG. 2 is a sectional side view depicting parallel elongated windows formed in a layer of silicon dioxide.

More particularly, in a preferred procedure for arriving at the wafer condition depicted in FIG. 2, the wafer 20 is first thermally oxidized to grow a 10,000 Angstrom masking layer 26 on the base layer surface 28. The layer 26 is then photolithographically patterned (not shown) employing conventional techniques, and then selectively etched to open the windows 30 and 30'. The photolithographic mask (not shown) is then removed.

Although not illustrated, prior to the opening of the windows 30 and 30' to define the overall active area of the device, a conventional device termination region comprising a P+ conductivity type peripheral strip with a diffusion depth of 10 microns is formed, also using the oxide layer 26, appropriately patterned, as a mask. A boron diffusion may be employed to form the device termination region.

Figure 3:
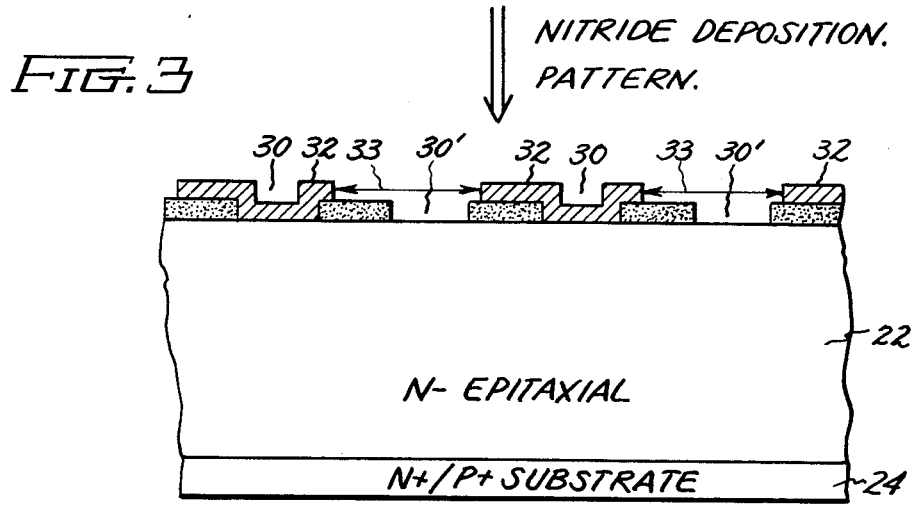
FIG. 3 depicts a patterned area of silicon nitride covering alternate windows in the silicon dioxide layer of FIG. 2.

Next, as may be seen in FIG. 3, an etchant barrier 32 of silicon nitride is formed, patterned so as to cover the windows 30 in the silicon dioxide layer 26 defining the ultimate locations of gate regions, but having windows 33 leaving open the windows 30' in the silicon dioxide layer 26 defining the ultimate locations of source regions. FIG. 3 deliberately illustrates misalignment which may be tolerated during the masking to form the patterned silicon nitride layer 32. It will accordingly be appreciated that device yield is improved by the avoidance of a control alignment step.

As a specific example, the silicon nitride layer 32 is deposited by the reaction of silane with ammonia employing the techniques described in V. Y. Doo, D. R. Nichols, and G. A. Silvey, "Preparation and Properties of Amorphous Silicon Nitride Films":, *J. Electrochem. Soc.*, Vol. 113, pp. 1279–1281 (1966); and T. L. Chu, C. H. Lee and G. A. Gruber, "The Preparation and Properties of Amorphous Silicon Nitride Films", *J. Electrochem. Soc.*, Vol. 114, pp. 717–722 (1967). The silicon nitride layer is in turn covered with a layer of pyrolytic silicon dioxide (not shown) grown by the oxidation of silane, as described in N. Goldsmith and W. Kern, "The Deposition of Vitreous Silicon Dioxide Films from Silane", *RCA Review*, Vol. 28, pp. 153–165 (1967); and B. J. Baliga and S. K. Ghandhi, "Growth of Silica and Phosphosilicate Films", *J. Appl. Phys.*, Vol. 44, pp. 990–994 (1973). This silicon dioxide layer (not shown) is then patterned using conventional photolithography to open windows above the source region windows 30', and the silicon nitride 32 is removed in those unprotected areas by etching in phosphoric acid at 180° C. (using the pyrolytic silicon dioxide as a mask) to actually open the windows 33. The pyrolytic silicon oxide is then removed by selective etching.

Next, as shown in FIG. 4A, diffused N+ type source regions 34 are formed. Specifically, impurities, such as phoshorus, appropriate to form diffused source regions of the one conductivity type and of higher conductivity than the base region 22, are diffused through the FIG. 3 source windows 30' into the base layer 22. A protective oxide layer 36 is grown, preferably simultaneously, over the diffused source regions 34. In order to facilitate later removal of the oxide layer 36 without removal of the oxide layer 26 this oxide layer 36 is thinner than the oxide layer 26 in general over the base layer 22.

Significantly, the source regions 34 are of limited lateral extent. As a result, following the formation of grooves described next with reference to FIG. 5, the source regions 34 do not extend to the grooves.

Figure 4B:
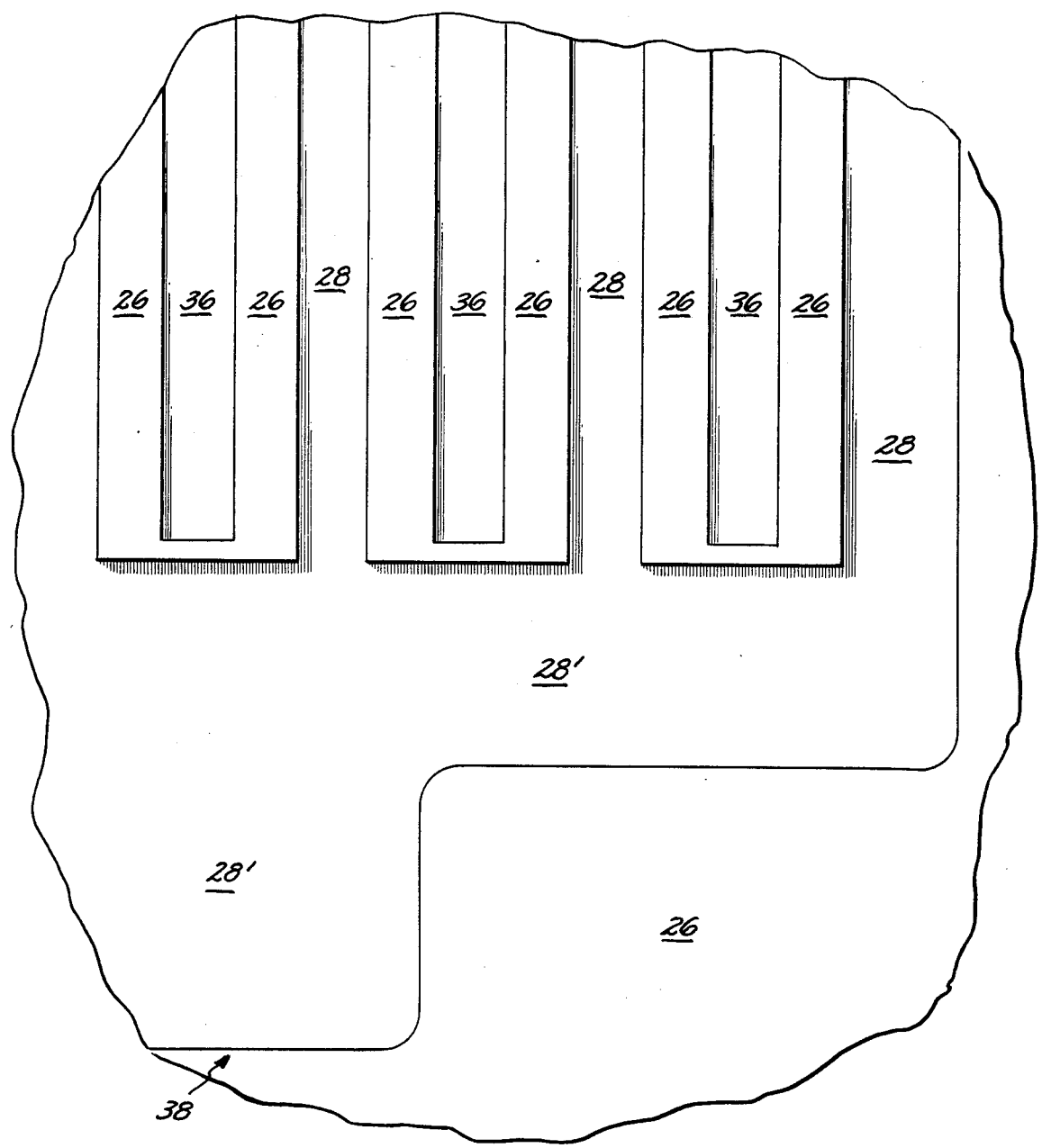
FIG. 4B is a plan view taken along line 4B—4B of FIG. 4A showing further details of the oxide pattern prior to the preferential etching.

The wafer as depicted in FIG. 4A is ready for a preferential etching step to form grooves for the gate regions, and also to form, at the same time, a recessed gate contact pad area 28, as may be better seen with reference to the plan view of FIG. 4B. In FIG. 4B, the upper surface 28 of the base layer 22 is exposed for preferential etching where grooves are to be formed, and additionally is exposed in areas 28' to define the recessed gate contact pad area 28. All remaining areas of the wafer are protected from etching by either the oxide layer 26, or the relatively thinner oxide layer 36 over the diffused source regions 34 (FIG. 4A).

At this point, using known preferential etching techniques, the base layer 22 is preferentially etched to form substantially vertically-walled grooves 40 beneath the source windows 30, as shown in FIG. 5, with the very little undercutting of the oxide 26. Nevertheless, to minimize metal deposition on the groove sidewalls as described hereinafter in more detail with reference to FIG. 7, there is some deliberate undercutting as may be seen in FIGS. 5–8. By way of example, an etching mixture of potassium hydroxide and isopropanol in a ratio of approximately 3:1 etches silicon at a rate of approximately five microns per hour when the mixture is maintained at approximately 60° C. This particular etching technique is described in the above-identified commonly-assigned Baliga et al. application Ser. No. 169,853. Other orientation-dependent etches may be employed in practicing the example as, for example, described in an article by D. L. Kendall, "On Etching Very Narrow Grooves in Silicon", *Appl. Phys. Lett.*, Vol. 26, pp. 195–198 (1975). The Kendall article discusses in greater detail specific masking and etching steps, as well as temperature and rate of etching.

While the preferred method of forming grooves 40 is the preferential etching technique just described, it will be appreciated that other techniques are known for forming such grooves, and there is accordingly no intention to limit the invention to this particular technique.

Next, to create junction gate regions 42 as illustrated in FIG. 6, impurities (e.g., boron) appropriate to form gate regions 42 of the opposite conductivity type (P+ type) are diffused into the sidewalls and bottoms of the grooves 40. This creates, in effect, junction gate regions of rectangular cross-section, for improved device performance characteristics as described hereinabove.

Of further significance, the channel sidewalls are in effect completely passivated by the continuous gate region 42, greatly simplifying the metallization step, described next. In particular, while sidewall metallization is generally to be avoided, sidewall metallization does not cause particularly severe problems in the present invention.

To prepare the device for metallization, the relatively thin oxide layer 36' in the source windows 30' is removed using buffered hydrochloric acid as a selective etchant. This also removes any oxide grown in the gate areas 42 during the boron diffusion.

Figure 7:
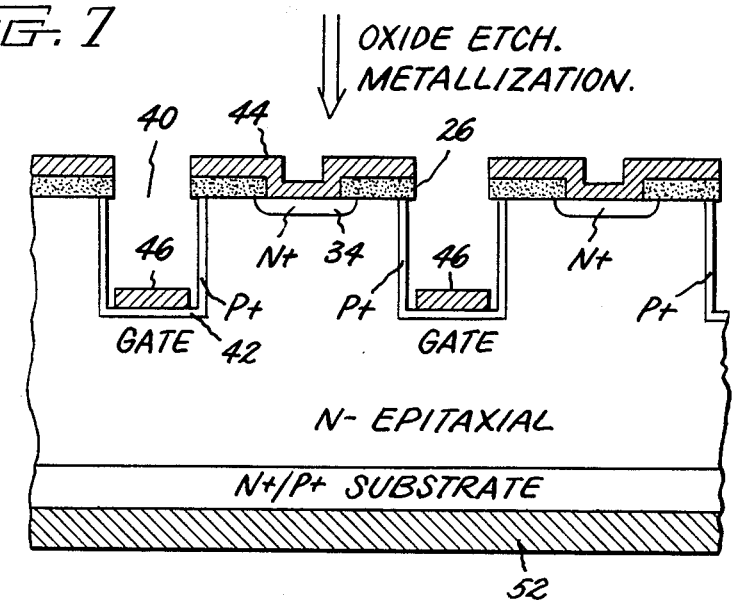
FIG. 7 is a sectional side view depicting a completed device with source, gate, and drain metallization.

Next, as shown in FIG. 7, aluminum metallization is evaporated onto the wafer surface to form elongated metallized source terminals 44 in ohmic contact with the source regions 34, and to form elongated metallized gate terminal fingers 46 in ohmic contact with the gate regions 42 recessed at the bottoms of the grooves 40. Due to the shadowing created by the overhang of the oxide 26 at the top of the grooves 40, the aluminum 44 and 46 in the source and gate areas, respectively, is automatically separated, as may be clearly seen from FIGS. 7 and 8. Thus, a critically aligned photolithographic metal definition step which would normally be required at this stage of device fabrication is avoided.

Figure 8:
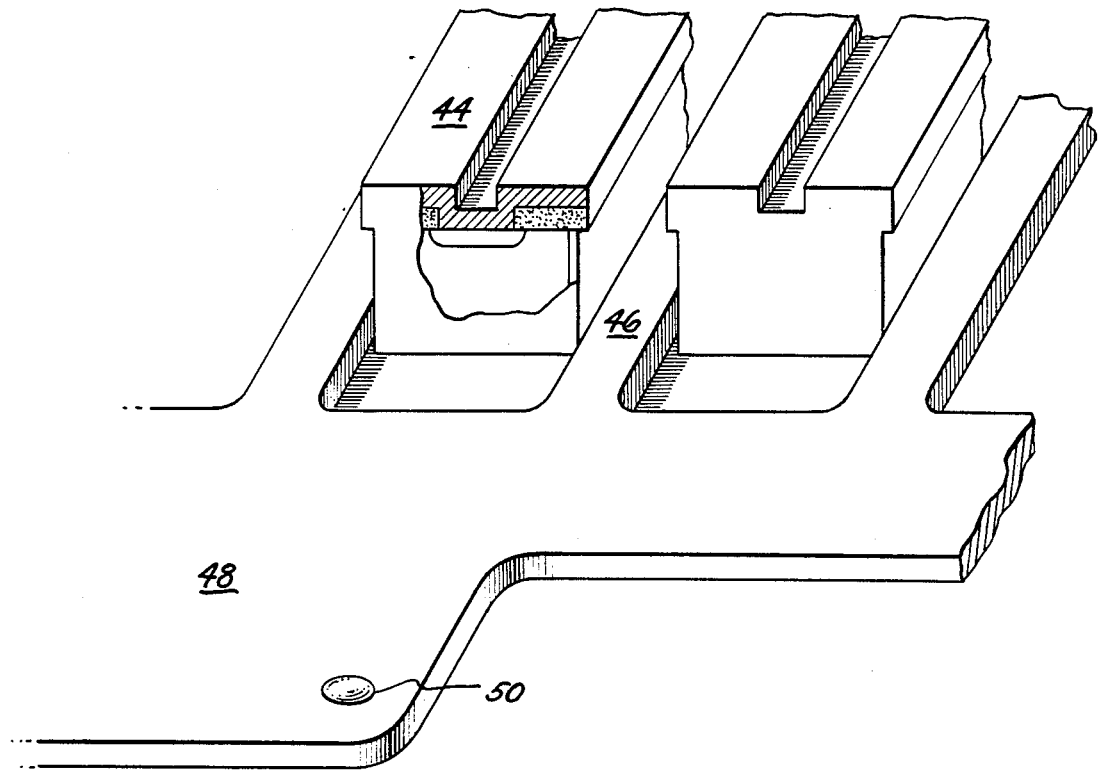
FIG. 8 is an isometric view of the completed device showing the manner in which the recessed gate contact fingers are connected to a recessed gate contact pad.

As may be seen from the isometric view of FIG. 8, a recessed gate bonding pad 48 is formed at the same time as regions 44 and 46, and is a physical and electrical extension of the gate terminal fingers 46. Also shown in FIG. 8 is a contact point 50 where a gate terminal lead is subsequently connected.

In summary, continuous contact metallization is provided over all of the source fingers 44 and all of the gate fingers 46. Further, the width of the source finger 44 metallization is maximized, decreasing the current density in the aluminum used to carry the source current. A low contact resistance to both the source and gate regions therefore results.

To complete the device, as shown in FIG. 7, a drain (or anode) metallized electrode 52 is formed in a subsequent step. Additionally, a large source (or cathode) terminal electrode (not shown) is placed over and soldered to the source metallization 44.

By way of example, an exemplary finished device has an active area of 800 microns by 800 microns, with 29 gate fingers and 27 interdigitated cathode fingers. Each source finger 34 has a length of 675 microns, and a width of 5 microns, thus providing the device with a total source area of $9.1 \times 10^{-4}$ cm$^2$. Breakdown voltages of over 500 volts were achieved.

In these recessed gate devices, it has been found that the gate groove depth plays a critical role in determining the device characteristics. As groove depth is increased, the blocking gain increases, while the saturated output drain current decreases because of an increase in the on-resistance as well as an increase in channel pinch-off effect. With a groove depth of 15 microns, devices with blocking gains of about 10 have been fabricated, with on-resistances of 1.5 ohms per cm$^2$. These devices have been found to have a unity power gain cut off frequency of 600 MHz, and a forced gate turn off switching time of less than 25 nanoseconds. Since the half-width of the vertical conduction channel exceeds the zero biased depletion layer width of the gate junction, the devices exhibit pentode-like characteristics wherein the devices operate in the ohmic regime where the drain current increases in proportion to the drain voltage. At the higher gate biased voltages, the high voltage recessed gate devices exhibit triode-like characteristics.

Accordingly, it will be appreciated that by the present invention there are provided techniques for the fabrication of high voltage, vertical channel, junction field effect transistors and field controlled devices, and devices so formed. Vertically-walled recessed gate regions are formed which are self-aligned to the source contacts, eliminating several critical photolithographic alignment steps, resulting in improved yield and higher breakdown voltages.

While a specific embodiment of the invention has been illustrated and described herein, it is realized that numerous modifications and changes will occur to those skilled in the art. It is therefore to be understood that the appended claims are intended to cover all such modifications and changes as fall within the true spirit and scope of the invention.

What is claimed is:

1. A method of fabricating a vertical channel electric field controlled device having a recessed gate structure and being of the type including a semiconductor base region of one conductivity type and a gate region of opposite conductivity type, said method comprising:

providing a semiconductor wafer having a base layer of the one conductivity type;

forming a layer of silicon dioxide with a plurality of windows on one surface of the base layer, alternate windows defining the ultimate locations of upper electrode regions and gate regions;

forming an etchant barrier of silicon nitride patterned so as to cover the windows in the silicon dioxide layer defining the ultimate locations of gate regions, and to leave open the windows in the silicon dioxide layer defining the ultimate locations of upper electrode regions;

introducing into the base layer through the windows in the silicon dioxide layer defining the ultimate locations of upper electrode regions impurities appropriate to form upper electrode regions of the one conductivity type and of higher conductivity than the base region;

growing an oxide layer over the diffused upper electrode regions thinner than the oxide layer over the remainder of the base layer;

removing the silicon nitride barrier to expose the windows in the silicon dioxide layer defining the ultimate locations of gate regions;

forming substantially vertically-walled grooves beneath the gate region windows;

introducing into the sidewalls and bottoms of the grooves impurities appropriate to form gate regions of the opposite conductivity type;

removing the oxide layer over the upper electrode regions; and evaporating metal onto the wafer surface to form metalized source terminals in ohmic contact with the upper electrode regions, and to form elongated metallized gate terminal fingers in ohmic contact with the gate regions at the bottoms of the grooves.

2. A method in accordance with claim 1, which further comprises deliberately undercutting the oxide layer surrounding the gate region windows when the vertically-walled grooves are formed.

3. A method in accordance with claim 1, which further comprises:

etching the base layer to form a recessed gate contact pad area at the same level as the bottoms of the grooves; and evaporating metal onto the gate contact pad area to form a gate contact pad as a physical and electrical extension of the gate terminal fingers.

4. A method in accordance with claim 1, wherein the base layer provided is of N− conductivity type, the upper electrode regions formed are of N+ conductivity type, and the gate regions formed are of P+ conductivity type.

5. A method of fabricating a vertical channel junction gate electric field controlled device having a recessed gate structure and being of the type including a semiconductor base region of one conductivity type and a gate region of opposite conductivity type, said method comprising:

providing a semiconductor wafer having a base layer of the one conductivity type, and of crystallographic orientation selected to facilitate preferential etching;

forming a layer of silicon dioxide with a plurality of elongated windows on one surface of the base layer, alternate windows defining the ultimate locations of upper electrode regions and gate regions;

forming a barrier of silicon nitride patterned so as to cover the windows in the silicon dioxide layer defining the ultimate locations of gate regions, and to leave open the windows in the silicon dioxide layer defining the ultimate locations of the upper electrode regions;

introducing into the base layer through the windows in the silicon dioxide layer defining the ultimate locations of upper electrode regions impurities appropriate to form electrode regions of the one conductivity type and of higher conductivity than the base region;

growing an oxide layer over the diffused electrode regions thinner than the oxide layer over the remainder of the base layer;

removing the silicon nitride barrier to expose the windows in the silicon dioxide layer defining the ultimate locations of the gate regions;

preferentially etching the base layer to form substantially vertically-walled grooves beneath the gate region windows with undercutting of the oxide layer surrounding the gate region windows;

introducing into the sidewalls and bottoms of the grooves impurities appropriate to form gate regions of the opposite conductivity type;

removing the oxide layer over the upper electrode regions; and evaporating metal onto the wafer surface to form metallized electrode terminals in ohmic contact with the upper electrode regions, and to form elongated metallized gate terminal fingers in ohmic contact with the gate regions at the bottoms of the grooves.

6. A method in accordance with claim 5, wherein the semiconductor base layer comprises silicon with a $<110>$ crystallographic orientation and with a set of $<111>$ planes at right angles to the $<110>$ surface, and the parallel elongated windows are defined along the $<211>$ direction.

7. A method in accordance with claim 5 which further comprises:

etching the base layer to form a recessed gate contact pad area at the same level as the bottoms of the grooves; and evaporating metal onto the gate contact pad area to form a gate contact pad as a physical and electrical extension of the gate terminal fingers.

* * * * *